(12) United States Patent
Mayr

(10) Patent No.: US 10,365,330 B2
(45) Date of Patent: Jul. 30, 2019

(54) BATTERY FUEL GAUGE CIRCUIT

(71) Applicant: Dialog Semiconductor (UK) Limited, London (GB)

(72) Inventor: Michael Mayr, Pfaffenhofen (DE)

(73) Assignee: Dialog Semiconductor (UK) Limited, London (GB)

( * ) Notice: Subject to any disclaimer, the term of this patent is extended or adjusted under 35 U.S.C. 154(b) by 785 days.

(21) Appl. No.: 14/944,624

(22) Filed: Nov. 18, 2015

(65) Prior Publication Data

US 2017/0003351 A1    Jan. 5, 2017

(30) Foreign Application Priority Data

Jul. 1, 2015  (DE) .................. 10 2015 212 328

(51) Int. Cl.
*G01R 31/36* (2019.01)
*G01R 31/367* (2019.01)
*G01R 31/382* (2019.01)
*G01R 31/389* (2019.01)
*G01R 31/392* (2019.01)
(Continued)

(52) U.S. Cl.
CPC ......... *G01R 31/367* (2019.01); *G01R 31/382* (2019.01); *G01R 31/389* (2019.01); *G01R 31/392* (2019.01); *G01R 31/3828* (2019.01); *G01R 31/3835* (2019.01)

(58) Field of Classification Search
CPC ............ G01R 31/3651; G01R 31/3662; G01R 31/3679; G01R 31/3606
See application file for complete search history.

(56) References Cited

U.S. PATENT DOCUMENTS

2008/0162059 A1 *   7/2008   Murakami ......... G01R 31/3624
                                                          702/63
2010/0090651 A1     4/2010   Sahu et al.
(Continued)

FOREIGN PATENT DOCUMENTS

EP            1 084 419         6/2010

OTHER PUBLICATIONS

German Office Action, File No. 10 2015 212 328.6, Applicant: Dialog Semiconductor (UK) Limited, dated Jul. 11, 2016, 12 pgs and English language translation, 9 pgs.
(Continued)

*Primary Examiner* — Regis J Betsch
*Assistant Examiner* — Jeremy A Delozier
(74) *Attorney, Agent, or Firm* — Saile Ackerman LLC; Stephen B. Ackerman

(57) ABSTRACT

A battery fuel gauge circuit for determining the state of charge of a rechargeable battery is presented. The circuit comprises:
   a coulomb counter for providing values that are indicative of a charging current or discharge current provided to/by the battery;
   a voltage sensor;
   a first pre-processing unit to provide a current change estimate based on the values provided by the coulomb counter;
   an event filter unit to confirm whether the current change estimate exceeds a certain threshold;
   an electromotive force unit to determine an electromotive force value of the battery;
   a state of charge estimator unit to determine the state of charge of the battery based on the electromotive force value.

28 Claims, 5 Drawing Sheets

(51) Int. Cl.
G01R 31/3828 (2019.01)
G01R 31/3835 (2019.01)

(56) References Cited

U.S. PATENT DOCUMENTS

2014/0217987 A1* 8/2014 Shim .................. G01R 31/3624
320/134
2016/0356855 A1* 12/2016 Tamegai ............ G01R 31/3624

OTHER PUBLICATIONS

"MIPI BIF Compliant Fuel Guage IC with PrediGauge Technology," 2 pgs, Infineon Product Brief, found: www.infineon.com/origa3, Jan. 2014.
MAX17047/MAX17050, ModelGauge m3 Fuel Gauge, Maxim integrated, Apr. 2015, pp. 1-47, found: www.maximintegrated.com.
Texas Instruments, Technical Reference bq27411-G1, Jan. 2014, pp. 1-56, Literature No. SLUUAS7B.

* cited by examiner

BATTERY FUEL GAUGE CIRCUIT

TECHNICAL FIELD

The present document relates to battery fuel gauge circuits. In particular, the present document relates to a battery fuel gauge circuit being adapted to estimate the state of charge of a battery in real-time during normal operation, i.e. without placing the battery in a dedicated operating state, e.g. by applying a certain predetermined load.

BACKGROUND

Today's battery management units (BMU's) and power management units (PMIC's) for devices powered by rechargeable batteries typically use coulomb counting to track the state of charge (SOC) of the battery. Error concealment is a possibility for improving SOC tracking because the coulomb counting not only accumulates the battery current Ibat(t) over time but also the error $\varepsilon(t)$ of the measurement. So, after a longer run time, the tracking error can grow significantly and thus impact the accuracy of the SOC result. As a remedy, error concealment may be used: after a certain period, the SOC derived from coulomb counting is re-calibrated to cancel the accumulated error.

Disadvantageously, known methods require the device, respectively, the battery to be put into a specific state, but the specific condition may not be met during normal use of a portable battery powered device. In other words, known methods are not suitable to perform error concealment in a real-time environment, i.e. during normal operation of the battery powered device.

SUMMARY

It is an object of the present invention to disclose a battery fuel gauge circuit adapted to perform SOC estimation without placing the battery in a dedicated operating state, e.g. a certain load condition.

According to a first aspect, a battery fuel gauge circuit for determining the state of charge of a rechargeable battery is disclosed. The circuit comprises a coulomb counter. Said coulomb counter tracks the amount of electric charge $\Delta Q$ that enters or leaves the battery (charge difference). Said amount of charge $\Delta Q$ that enters or leaves the battery in a given time period (e.g. 1 sec) corresponds to the average battery current for that time period. Thus, time-discrete information (e.g. having a sampling rate of 1 sec) regarding the average battery current can be derived from the charge values that the coulomb counter provides. In other words, from the charge values provided by the coulomb counter, samples of the (average) charging current or discharge current provided to/by the battery can be derived, and the terms current samples, average battery current and charge difference (electric charge entering/leaving the battery) are sometimes used interchangeable in this document.

The battery fuel gauge circuit may further include a voltage sensor for providing voltage samples of the voltage provided by the battery.

Furthermore, the battery fuel gauge circuit comprises a first pre-processing unit. The first pre-processing unit may be adapted to provide a current change estimate based on current samples (i.e. the charge difference) provided by the coulomb counter, said current change estimate indicating an unforced drop of charging/discharge current. Said unforced current drop is caused by the normal operation of the device (i.e. not forced in order for the SOC measurements) and is detected at point of time $t_0$, specifically, the unforced current drop occurs in an observation window around point of time $t_0$. In other words, the first pre-processing unit may provide signal processing means which are adapted to identify a change of battery current. Said identification may be performed based on/within an observation window having a certain observation window width. More in detail, the provided current change estimate indicating an unforced drop of charging/discharge current may be proportional to the change of charging/discharge current in the observation window. In an example embodiment, the current change estimate may be indicative of the difference between the accumulated charging/discharge current in a first half of the observation window and the accumulated charging/discharge current in a second half of the observation window.

The battery fuel gauge circuit may further comprise an event filter unit. The event filter unit may be adapted to confirm whether the current change estimate indicating an unforced drop of charging/discharge current exceeds a certain threshold. For example, the event filter unit may comprise a comparator adapted to decide whether the current change estimate is above said threshold thereby evaluating if there is a significant change of charging/discharge current within the observation window.

In addition, the battery fuel gauge circuit may comprise an electromotive force unit. The electromotive force unit may be adapted to determine an electromotive force value of the battery based on voltage and current information before and after a confirmed drop of charging/discharge current at point of time $t_0$. So, in other words, in case that a significant change of charging/discharge current of the battery is identified at point of time $t_0$, which allows a reliable SOC estimation, the current electromotive force value is determined by the electromotive force unit. Based on said electromotive force value, a state of charge estimator unit is able to determine the state of charge of the battery.

The main advantage of the suggested battery fuel gauge circuit is that—for estimating the SOC—the battery does not have to be artificially put into a certain state (e.g. SOC<20%) but SOC can be determined in any operating state of the battery as long as the battery load situation (e.g. occurrence of a rapid change of the battery current) allows a reliable SOC estimation.

According to embodiments, the event filter unit may further comprise a correlator, said correlator receiving information derived from the charging/discharge current and a prototype function which represents a certain curve. The correlator may be adapted to determine whether the information derived from the charging/discharge current and the prototype function comprise a similar shape. So in other words, besides a first event filter branch adapted to confirm whether the current change estimation indicating an unforced drop of charging/discharge current exceeds a certain threshold, a second event filter branch may be included in the event filter, said second branch investigating information derived from the shape of the charging/discharge current over time with respect to the prototype function. According to an embodiment, the prototype function may be a step function. Other prototype functions are possible as well, e.g. a current dip or bump of a given length. For example, the information derived from the charging/discharge current may be the mean value (e.g. a running average) of the charging/discharge current in a certain period of time, for example, the mean value of the charging/discharge current within half the observation window. Said information may be provided to the correlator in order to determine the similarity (in terms of shape of curves) of said information derived from the charging/discharge current over time with said given prototype function. In case that said correlator indicates a significant similarity (e.g. the output value of the correlator exceeds a certain correlation threshold), an unblock signal may be provided. Said unblock signal may be used as a further decision criterion for improving the detection of a battery load situation (e.g. rapid load change) suitable for SOC estimation.

According to embodiments, the event filter unit may be further adapted to determine whether the charge or discharge rate (i.e. temporal change) of the battery is above a given charge/discharge rate threshold. So, the event filter unit may include a third event filter branch for evaluating the charge/discharge rate of the battery. According to a first example, the event filter unit may comprise a comparator, said comparator providing an unblock signal if the charge or discharge rate is above the charge/discharge rate threshold, thereby ensuring that the battery load allows a reliable SOC estimation. According to another embodiment, the event filter unit may comprise a window comparator, said window comparator receiving a lower charge/discharge rate threshold value and an upper charge/discharge rate threshold value in order to ensure that the current charge or discharge rate is between said upper and lower threshold value. Thereby nonlinear behavior of the battery caused by high/low battery loads leading to an inaccurate SOC estimation is avoided.

In addition, there may be a fourth event filter branch considering the time passed since the last SOC estimation. Said fourth event filter branch may only provide an unblock signal if the time passed since the last SOC estimation is above a certain time threshold. Thereby, frequent re-calibration cycles can be avoided.

It must be noted that not all event filter branches must be present in all embodiments and, indeed, some embodiments use only some of the event filter branches to detect and confirm presence of an unforced drop, and thereby trigger the electromotive force unit to calculate the electromotive force value.

According to embodiments, the electromotive force unit may comprise an enabling port, said enabling port being coupled with the output of the event filter unit in order to trigger the electromotive force unit by the event filter unit. As mentioned above, the event filter unit may comprise one or more event filter branches in order to check different criteria. Enabling information may be only provided to the electromotive force unit if all event filter branches (that are used in a particular embodiment) provide an unblock signal, i.e. the criteria checked by said event filter branches are fulfilled. So, in other words, the calculation of the electromotive force value is only performed if all criteria evaluated by the event filter are fulfilled.

According to embodiments, the first pre-processing unit may be adapted to provide said current change estimate based on a certain observation window. Said observation window may be a sliding window comprising a certain width. Said observation window may be centered with respect to point of time t0 (i.e. the point in time where an unforced current drop has been detected). Thereby, it is possible to track the battery current over a certain time window and avoid erroneous SOC estimation triggering.

According to embodiments, the first pre-processing unit may be adapted to provide a first average current value, said first average current value may be established based on current samples (i.e. charge differences) of a first half of the observation window, and a second average current value, said second average current value being established based on current samples of a second half of the observation window. Based on said first and second average current values, it is possible to evaluate said electromotive force value without considering the interior/internal resistance of the battery.

According to embodiments, the battery fuel gauge may comprise a second pre-processing unit, the second pre-processing unit receiving voltage samples from the voltage sensor and being coupled with the electromotive force unit for providing a first average voltage value and a second average voltage value to the electromotive force unit. Said first average voltage value is established based on voltage samples within a first half of the observation window and said second average voltage value is established based on voltage samples within a second half of the observation window. Based on said first and second average voltage values, it is possible to evaluate said electromotive force value without considering the interior resistance of the battery.

According to embodiments, the first and/or second pre-processing unit are/is adapted to filter the current samples or voltage samples by means of a low-pass filter. Thereby, the influence of high frequency variations of the battery current is eliminated or at least reduced. In case of using a low-pass filter for filtering the current samples or voltage samples, also a low-pass filter may be applied to the prototype function used as an input of the correlator to maintain similar filter distortions to shapes of these curves.

According to embodiments, the electromotive force unit may be adapted to calculate the electromotive force (EMF) of the battery based on the following formula:

$$EMF(t_0) = \frac{\overline{V_{bat}}^{\{t_0, t_0 + \frac{1}{2}\tau\}} * \overline{I_{bat}}^{\{t_0 - \frac{1}{2}\tau, t_0\}} - \overline{V_{bat}}^{\{t_0 - \frac{1}{2}\tau, t_0\}} * \overline{I_{bat}}^{\{t_0, t_0 + \frac{1}{2}\tau\}}}{I_{drop}(t_0)}$$

wherein:
τ: observation window;
$\overline{V_{bat}}^{\{t_0 - 1/2\tau, t_0\}}$: first average voltage value;
$\overline{V_{bat}}^{\{t_0, t_0 + 1/2\tau\}}$: second average voltage value;
$\overline{I_{bat}}^{\{t_0 - 1/2\tau, t_0\}}$: first average current value;
$\overline{I_{bat}}^{\{t_0, t_0 + 1/2\tau\}}$: second average current value; and
$I_{drop}(t_0)$ change of current within the observation window τ.

According to embodiments, the state of charge estimator unit may be adapted to determine the state of charge of the battery based on a look-up table. Said look-up table may provide a state of charge value based on the electromotive force value provided by the electromotive force unit. Said look-up table may be specific to the battery chemistry and may be stored in a storage entity being accessible by the battery fuel gauge circuit.

According to embodiments, the state of charge estimator unit may be coupled with a temperature sensor, the temperature sensor measuring the temperature of the battery. The look-up table may provide a state of charge value based on the electromotive force value and said measured temperature. Furthermore, the look-up table may be also staggered in values of C-rate (charge/discharge rate).

According to embodiments, the output of the state of charge estimator unit may be used for recalibrating the state of charge measurement value provided by a state of charge accumulator, said state of charge accumulator providing a state of charge measurement value based on current samples provided by the coulomb counter. So in other words, the SOC tracking provided by integrating the current values provided by the coulomb counter is adjusted by means of the SOC estimation value.

According to embodiments, the battery fuel gauge circuit may comprise a full charge capacity estimator being adapted to estimate the full charge capacity of the battery based on consecutive state of charge estimation values provided by the state of charge estimator unit and consecutive state of charge measurement values provided by the state of charge accumulator. Thereby, it is possible to adapt the full charge capacity with increasing lifetime of the battery, which full charge capacity typically decreases with increasing lifetime.

According to embodiments, the battery fuel gauge circuit may comprise a state of health estimator (SOH) unit, said state of health estimator unit being adapted to calculate the interior resistivity value of the battery based on voltage and current samples and estimate the state of health value based on a look-up table. The look-up table may indicate a state of health value based on the interior resistivity value, the temperature of the battery and the state of charge of the battery. Based on the calculated interior resistance of the battery, the SOH estimator unit may use a predetermined reference table for estimating the SOH of the battery by bi- or tri-linear table interpolation.

According to a further aspect, a method for determining the state of charge of a rechargeable battery is disclosed. The method comprises the steps of:

sampling charging current or discharge current provided to/from the battery, thereby establishing current samples that are indicative of a charge difference in the battery within the respective sampling period;

sampling voltage provided by the battery, thereby establishing voltage samples;

detecting a current change estimate based on consecutive current samples, said current change estimate indicating an unforced drop of charging/discharge current being detected at point of time $t_0$;

determining whether the current change estimate exceeds a certain threshold;

determining an electromotive force value of the battery based on voltage samples and current samples before and after the point of time $t_0$ if the current change estimate exceeds said threshold; and determining the state of charge of the battery based on the electromotive force value.

The sampled charging current or discharge current provided to/from the battery may be based on the output values provided by a coulomb counter which are indicative of the amount of electric charge $\Delta Q$ that enters or leaves the battery, i.e. the charge difference of the battery for the corresponding sampling periods. Thus, the current samples are indicative of the average current to/from the battery within the respective sampling period.

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner. Further, if not explicitly indicated otherwise, embodiments of the invention can be freely combined with each other.

BRIEF DESCRIPTION OF THE DRAWINGS

The invention is explained below in an exemplary manner with reference to the accompanying drawings, wherein.

DESCRIPTION

Figure 1:
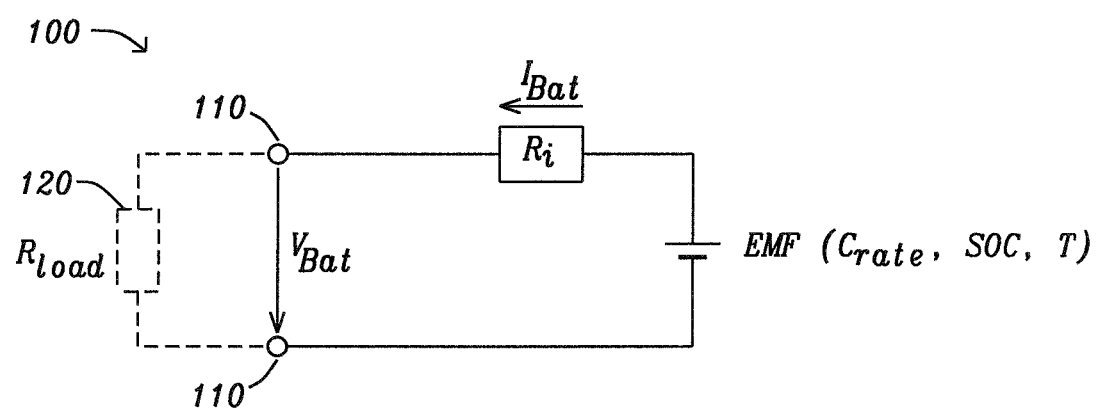
FIG. 1 illustrates an example equivalent circuit of a battery according to a $1^{st}$ order battery model.

FIG. 1 shows an equivalent circuit according to a $1^{st}$ order battery model 100 of a rechargeable battery. The terminals 110 indicate the battery terminals which are coupled with an electric load $R_{load}$ 120. Said electrical load may be, for example, the electric components of a handheld device, i.e. a processor, memory, display and/or camera of the laptop, PDA, cellular phone etc. It is worth mentioning that the present invention is not limited to said example handheld devices. For example, the battery fuel gauge circuit may be also applicable within other battery-driven devices, e.g. battery-operated tools or toys.

At terminals 110 the battery voltage $V_{bat}$ is provided. The interior of the battery can be modeled by an interior resistance $R_i$ and a voltage source providing the electromotive force EMF. The relationship between voltage and current of the battery is highly nonlinear and depends on a set of multiple parameters. For example, the value of the interior resistance $R_i$ depends on the temperature of the battery and the age of the battery. The EMF value depends on the current load of the battery ($C_{rate}$), the state of charge (SOC) and the temperature (T) of the battery. Furthermore, the technology of the battery has significant influence on the voltage-current characteristics of the battery.

Disclosed battery management units and power management units (PMIC's) for devices powered by rechargeable batteries use combinations of coulomb counting and lookup procedures for error concealment to track the state of charge (SOC) of the battery. The error concealment is an essential part of the SOC tracking because the coulomb counting not only accumulates the battery current $I_{bat}(t)$ over time, but also the error $\varepsilon(t)$ of the measurement.

$$SOC(t)[\%] = 100 - \frac{100}{FCC} * \int_0^t I_{bat}(t) + \varepsilon(t)\, dt$$
$$= 100 - \frac{100 * Q(t)}{FCC} + \frac{100}{FCC} * \int_0^t \varepsilon(t)\, dt$$

After a longer run time, the tracking error $\int_0^t \varepsilon(t)\, dt$ can grow significantly and thus impact the precision of the SOC(t) result.

In order to compensate the error, a remedy error concealment is used. After a certain period, the SOC provided by coulomb counting is being re-calibrated to cancel the accumulated error $\int_0^t \varepsilon(t)\, dt$.

In the following, a battery fuel gauge circuit is described which is adapted to perform the error concealment in a real-time environment. A battery powered portable device typically shows some activity even when it is resting in active standby. Due to digital processing of these devices, they occasionally show rapid changes of the load current for a short time. E.g. dips in the load current are appearing when a wireless connection is maintained because the power amplifiers which send status messages on a regular basis are being temporarily powered. If the device is activated by the user, the current continues to show a bumpy profile originating from the activity of the main processor and its peripherals but on a higher average load level. The proposed battery fuel gauge circuit monitors the temporal variation of the electric current provided by the battery, thereby determining a suitable load situation which may be used for SOC error concealment, i.e. for re-calibrating the SOC provided based on the output of the coulomb counter.

By using upper-mentioned $1^{st}$ order battery model, it is possible to eliminate (by calculation) the unknown interior resistance $R_i = R_i(T, age)$ of the battery and to compute the electromotive force $EMF(C_{rate}, SOC, T)$ based on the battery voltage $V_{bat}$ and battery current $I_{bat}$ before and after a significant and rapid load current change. From the EMF, an estimation of the SOC of the battery can be deduced.

The same relation also allows calculating the interior resistance $R_i(T, age)$. The trend of the estimated internal resistance $R_i$ is derived under comparable conditions of SOC and T enables tracking of the state of health (SOH) of the battery.

In a broad sense, the data acquired by a coulomb counter and a voltage sensor are pre-processed for calculating the voltage, respectively, the current difference around the time of interest. If an event filter detects a candidate, i.e. a sudden change of the load current which is sufficient for estimating SOC, it enables the EMF calculation. The EMF calculator then computes the estimated EMF from the input data. The result is feed into the SOC estimator which is looking up the estimated SOC via bi- or tri-linear estimation from a reference table. The resulting estimated SOC value is finally overwriting the SOC as accumulated from the coulomb counter data. In parallel, the full charge capacity of the battery cell in use may also be updated.

In the following, possible components of a disclosed battery fuel gauge apparatus are introduced and different aspects of embodiments are briefly discussed.

Pre-Processing:

The same pre-processing may be used for the acquired battery voltage $V_{bat}$ and the battery current $I_{bat}$. Because of the identity in processing data, this element is described in the following mainly for $I_{bat}$.

The pre-processing stage may compute the voltage drop respectively the current drop in an observation window of fixed or configurable duration $\tau$ around the time of interest $t_0$ in real-time. By operating a switch, the pre-processor can be configured to receive either the raw sensor values or the values after passing a low-pass filter. The edge frequency of the low-pass filter may be either fixed or configurable.

The inrushing data (battery voltage $V_{bat}$ or battery current $I_{bat}$) may be accumulated in a loop. In a parallel branch, the data may be delayed by $$\frac{\tau}{2}$$

(half the period of the observation window). The delayed data is subtracted at a summing node. Therefore, the output of the accumulator is proportional to the average of the input data within a window of duration $$\frac{\tau}{2}.$$

The output of the accumulator may be connected to a second summing node. A parallel branch delays the accumulator output by $$\frac{\tau}{2}$$

and applies it to a subtracting port of the summing node. Hence, the output of the summing node $I_{drop}$ is proportional to the change of the load current in the observation window. Secondary outputs are supplying $$I_{average}(t) \text{ and } I_{average}\left(t - \frac{\tau}{2}\right)$$

for further use.

Event Filter:

The task of the event filter is to identify and localize rapid changes in the real-time data stream. The identified rapid changes should be sufficient for allowing a decent EMF estimation. The event filter is intended to search for intrinsically generated rapid changes, but is also capable of detecting forced changes.

The event filter may consist of a combination of elements listed below:
- correlator using a fixed or configurable prototype function $f_{proto}$;
- threshold comparator having a fixed or configurable threshold;
- window comparator having fixed or configurable thresholds;
- slew rate comparator comparing the slew rate of the input to a fixed or configurable threshold.

In an exemplary implementation of the event filter, the apparatus flags an event if:
a) correlation result $R^2$>threshold$_R$;
b) and the load current change $I_{drop}$>threshold$_1$;
c) and $C_{rate}$>threshold$_C$ or if a window comparator is used: threshold$_{C1}$≥$C_{rate}$>threshold$_{C2}$;
d) and $t_{elapsed}$>$t_{inactive}$ threshold$_t$ Condition a) allows searching for shapes of $I_{average}$ (t) which are similar to the given prototype function $f_{proto}$. The shape $f_{proto}$ needs to be adapted depending on the selected type of pre-processing. When a configurable architecture is being used, the selectivity of the element can be varied. i.e. the opening of the observation window $\tau$ can be extended and/or the threshold for $R^2$ can be raised for increasing the confidence of a signal match.

The additional condition b) may be applied because the correlator is insensitive to the amplitude of the processed signals. Condition b) forces the event filter to ignore small changes of the load current which might be caused by noise or fluctuations of the measurement rather than a rapid signal change.

Condition c) allows limiting the average $C_{rate}$ to a certain range if the lookup table should remain 3-dimensional. This condition might be dropped if a 4-dimensional lookup table in the SOC estimator is being used.

Condition d) acts as a gate preventing that the SOC is being updated too often. Typically the drift of a decent coulomb counter is much less than $$1\frac{\%}{\text{hour}}.$$

Therefore updating the SOC is required after several hours only.

The event filter may be optimized by adding or removing conditionals for optimal adaption to the application or another class of devices.

EMF Calculator:

In case the event filter detects a rapid change of $I_{average}(t)$ at the time $t_0$, the EMF calculation block is enabled. It then computes an estimation of the battery $EMF(t_0)$.

SOC Estimator:

The SOC estimator may consist of a table lookup mechanism combined with a bi- or tri-linear interpolator. Based on the estimated $EMF(t_0)$ computed by the EMF calculator and the temperature $T(t_0)$, it calculates an estimation for actual SOC percentage of the battery from the reference table staggered in voltage and temperature. In case the reference table is additionally staggered in $C_{rate}$ as well, a tri-linear interpolation is used to determine the SOC percentage from an extended input data set. The reference tables for the interpolation may be acquired beforehand from a statistical representative sample of relevant batteries.

FCC Estimator:

Tracking of a capacity decay of the battery may be performed by calculating the full charge capacity (FCC) of the battery cell. The FCC may be calculated based on the incremental discharge $\Delta SOC$ between two SOC estimation points flagged by the event filter. Using and $FCC_{estimate}$ and $FCC_{nominal}$ of the battery, the state of health (SOH) can be determined by the BMU.

SOH Estimator:

In addition to estimate the SOH of the battery by the FCC decay over time, a lookup mechanism similar to the SOC estimator may optionally be added to the apparatus. Based on the calculated $R_i$, the SOH estimator may use a predetermined reference table for estimating the SOH of the battery by bi- or tri-linear table interpolation.

Figure 2:
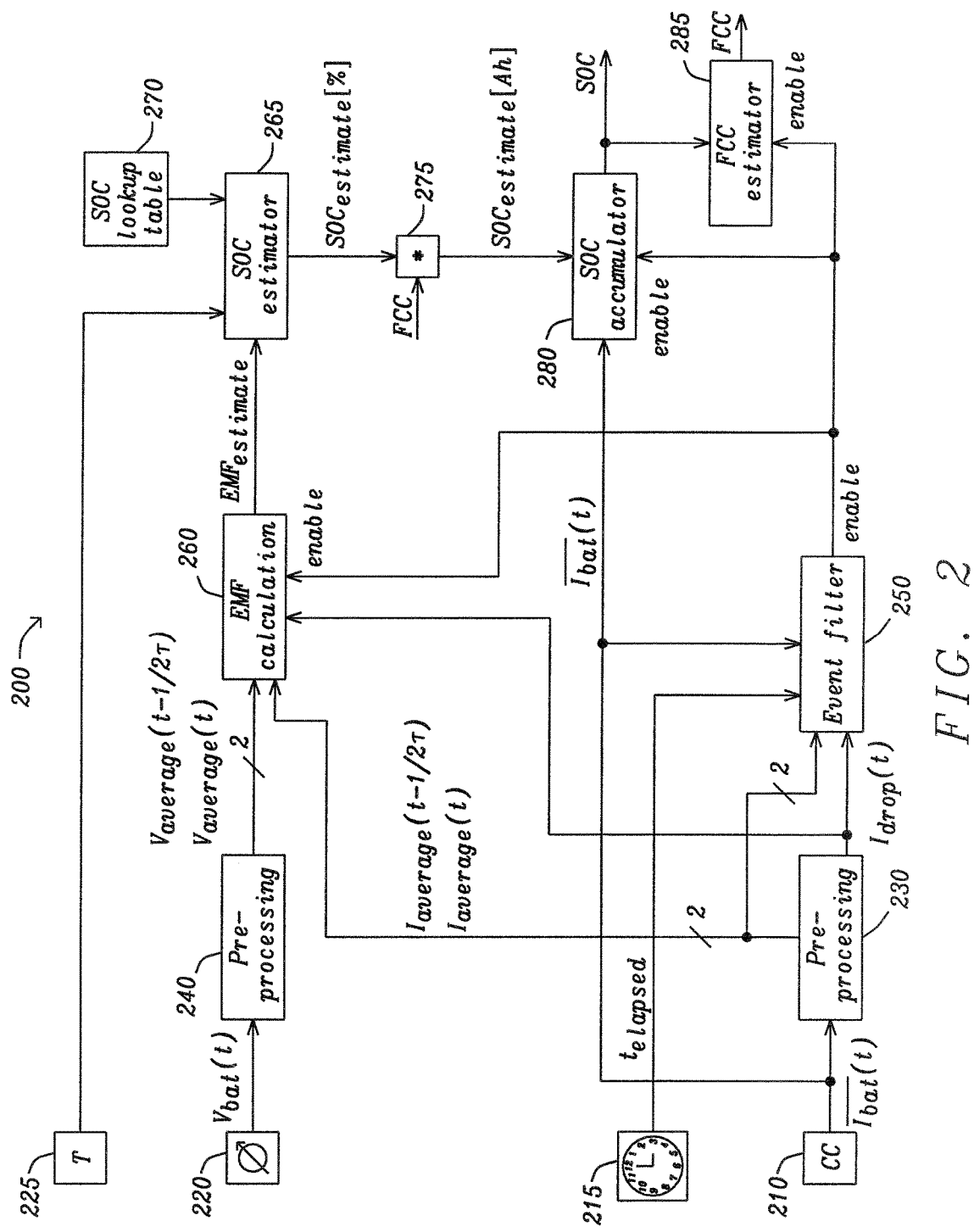
FIG. 2 illustrates an example schematic block diagram of a battery fuel gauge circuit.

Further details of disclosed embodiments are set out in the following. FIG. 2 shows a schematic block diagram of an example battery fuel gauge circuit 200. For providing input data to the battery fuel gauge circuit 200, said circuit 200 is coupled with a coulomb counter 210, a reference clock or timer 215, a voltage measurement entity 220 and a temperature sensor 225.

The coulomb counter 210 typically is an analogue device that tracks the electric charge in/out of the battery and provides values for the amount of electric charge $\Delta Q$ that enters or leaves the battery (i.e. the charge difference) within a time period $\tau$ (e.g. 1 s). The relation between electric charge and electric current is:

$$Q(t)=\int_0^t I(t)dt$$

$$\Delta Q = Q(t+\tau)-Q(t)=\int_t^{t+\tau} I(t)dt$$

The average electric current during time period $\tau$ is:

$$\overline{I(t)}^\tau = \frac{\Delta Q}{\tau}$$

Thus, one can determine discrete information regarding the (average) battery current $I_{Bat}$ (also referred to as current samples) from the charge differences $\Delta Q$ that the coulomb counter 210 provides for each sampling period. In other words, the output of the coulomb counter 210 may correspond to a mean value of the battery current $\overline{I_{Bat}(t)}$, for instance the mean value of the battery current $\overline{I_{Bat}(t)}$ during a certain time window (e.g. 1 s):

$$\overline{I(t)}^{1s} = \frac{\Delta Q}{1s} = \Delta Q$$

If the coulomb counter is always reset after reading the charge difference $\Delta Q$ for a sampling period of 1 s, then the values provided by the coulomb counter correspond directly to the average current $\overline{I(t)}^{1s}$ for this sampling period.

The reference clock or timer 215 may provide an output indicating the period of time elapsed since the last re-calibration cycle. As already mentioned before, the tracking error $\int_0^t \varepsilon(t) dt$ of SOC tracking based on the output of the coulomb counter increases linearly with increasing tracking duration. Based on the output of the reference clock or timer 215 it is possible to trigger a correction cycle, said correction cycle leading to a minimizing or removal of the tracking error. The voltage measurement entity 220 may provide discrete information regarding the battery voltage $V_{Bat}(t)$. For example, the voltage measurement entity 220 may output voltage samples of the battery voltage $V_{Bat}(t)$, e.g. from an ADC. Based on said voltage samples, the EMF of the battery may be derived.

Finally, the temperature sensor 225 may provide an output signal proportional to the temperature of the battery. For example, the temperature sensor 225 may provide a voltage value proportional to the temperature of the battery or the temperature sensor 225 may provide a temperature value itself (e.g. a digital temperature value). Based on said value, it may be possible to compensate the influence of the temperature when estimating the SOC.

The coulomb counter 210 may be coupled with a first pre-processing unit 230, i.e. the first pre-processing unit 230 receives the battery current information $I_{Bat}$ provided by the coulomb counter 210. As already mentioned before, the coulomb counter 210 may provide multiple sampled battery current values over time. The first pre-processing unit 230 may be adapted to process said multiple sampled battery current values. For example, the first pre-processing unit 230 may receive information regarding the duration $\tau$ of an observation window based on which the SOC estimation is performed. For example, the duration $\tau$ of the observation window may be in the range of 5 s to 50 s, specifically 10 s, 20 s, 30 s or 40 s or any other value in the range of 5 s to 50 s. The first pre-processing unit 230 may provide information regarding the current drop $I_{drop}$ within said observation window. Said current drop $I_{drop}$ may refer to a certain point of time $t_0$ within the observation window (typically the center position). In addition, the first pre-processing unit 230 may provide information regarding the current values before and after said point of time $t_0$ at which the current drop $I_{drop}$ occurs. Said current values may be, for example, mean current values obtained by averaging multiple samples of current values. A more detailed description of the first pre-processing unit 230 is provided below with reference to FIG. 3.

The battery fuel gauge circuit 200 further comprises a second pre-processing unit 240. Said second pre-processing unit 240 may provide at least information regarding the voltage values before and after said point of time $t_0$ at which the current drop $I_{drop}$ has been detected. Said voltage values may be, for example, mean voltage values obtained by averaging multiple samples of voltage values within the observation window. The first and second pre-processing units 230, 240 may be reconfigurable, i.e. said pre-processing units 230, 240 may receive one or more parameters based on which the pre-processing is performed, e.g. defining the window width.

The first pre-processing unit 230 is coupled with an event filter unit 250. The event filter unit 250 is adapted to identify and localize rapid changes or drops in the stream of samples referring to the drop of battery current $I_{drop}$. Said event filter unit 250 may be adapted to evaluate and identify change or drop of battery current $I_{drop}$. For example, the amplitude of the current drop $I_{drop}$ may be compared with a threshold in order to determine whether the current drop $I_{drop}$ is sufficient/significant for allowing a decent EMF estimation. If so, the event filter unit 250 provides an enabling signal at its output for triggering the EMF calculation. It is worth mentioning that the current drop $I_{drop}$ may be an unforced current drop $I_{drop}$, i.e. a current drop which occurs during normal operation of the battery-driven device and not a current drop caused on purpose for measuring EMF. Nevertheless, the event filter unit 250 may also be capable of detecting forced current drops. Further wore, the event filter unit 250 may additionally receive one or more further current values, e.g. the average current $I_{average}$ (t) within the observation window or a certain portion of the observation window. In addition, the event filter unit 250 may receive the output of the reference clock or timer 215 in order to determine if the period of time passed since the last re-calibration has exceeded a certain threshold value. A more detailed description of the event filter unit 250 is provided below with reference to FIG. 4.

In case that the event filter unit 250 provides an enabling signal (indicating that an EMF calculation can be performed), the electromotive force unit 260 is triggered to perform an EMF calculation. The electromotive force unit 260 is coupled with the first and second pre-processing unit 230, 240 for receiving information regarding the voltage and current values before and after the current drop at the point of time $t_0$. More in detail, the first pre-processing unit 230 may provide a first current value referring to the average battery current provided in a first half of the observation window before point of time $t_0$ (mean value $I_{average}$ of the current samples in the time range $[(t_0-\frac{1}{2}\tau) \ldots (t_0)]$) and a second half of the observation window after said point of time $t_0$ (mean value $I_{average}$ of the current samples in the time range $[(t_0) \ldots (t_0+\frac{1}{2}\tau)]$). Similarly, the second pre-processing unit 240 may provide a first voltage value referring to the average battery voltage provided in a first half of the observation window before point of time $t_0$ (mean value $I_{average}$ of the voltage samples in the time range $[(t_0-\frac{1}{2}\tau) \ldots (t_0)]$) and a second half of the observation window after said point of time $t_0$ (mean value $I_{average}$ of the voltage samples in the time range $[(t_0) \ldots (t_0+\frac{1}{2}T)]$). In addition, the electromotive force unit 260 may receive the current drop value $I_{drop}$ in order to calculate the EMF-value of the battery.

According to an embodiment, the EMF-value may be calculated based on the following formula:

$$EMF(t_0) = \frac{\overline{V_{bat}}^{\{t_0, t_0+1/2\tau\}} * \overline{I_{bat}}^{\{t_0-1/2\tau, t_0\}} - \overline{V_{bat}}^{\{t_0-1/2\tau, t_0\}} * \overline{I_{bat}}^{\{t_0, t_0+1/2\tau\}}}{I_{drop}(t_0)}$$

wherein
τ: observation window;
$\overline{V_{bat}}^{\{t_0, t_0+1/2\tau\}}$: is the average value of the battery voltage in period $t_0 \ldots t_0+\frac{1}{2}\tau$;
$\overline{V_{bat}}^{\{t_0-1/2\tau, t_0,\}}$: is the average value of the battery voltage in period $t_0-\frac{1}{2}\tau \ldots t_0$;
$\overline{I_{bat}}^{\{t_0, t_0+1/2\tau\}}$: is the average value of the battery current in period $t_0 \ldots t_0+\frac{1}{2}\tau$;
$\overline{I_{bat}}^{\{t_0-1/2\tau, t_0,\}}$: is the average value of the battery current in period $t_0-\frac{1}{2}\tau \ldots t_0$;
$I_{drop}$ is the change of battery current within the observation window $(t_0-\frac{1}{2}\tau \ldots t_0+\frac{1}{2}\tau)$;

As further shown in FIG. 2, the electromotive force unit 260 is coupled with a state of charge (SOC) estimator unit 265. The state of charge estimator unit 265 may use a table lookup mechanism combined with a multi-linear (e.g. bi- or tri-linear) interpolator. More in detail, said state of charge estimator unit 265 may have access to a SOC lookup table 270. Said lookup table may be staggered in EMF and temperature, i.e. may provide SOC-information based on discrete values of EMF and temperature T. In case that the present value of EMF or temperature T is not included in the lookup table, the interpolator can interpolate the SOC value by using adjacent EMF and temperature values. In other words, the state of charge estimator unit 265 calculates an estimation for actual SOC based on the estimated EMF provided by the electromotive force unit 260 and the temperature T provided by the temperature sensor 225 by using the SOC lookup table 270.

A mapping using bilinear interpolation may be performed according to:

$$\{EMF(t_0), T(t_0); threshold_1 \geq C_{rate}(t_0) > threshold_2\} \mapsto SOC_{estimate}(t_0)$$

The range $threshold_1 \geq C_{rate}(t_0) > threshold_2$ indicates that the charge/discharge rate (c-rate) of the battery is in the interval between $threshold_1$ and $threshold_2$ specified by the respective lookup table 270 in order to be able to determine the SOC value based on said lookup table 270 with a desired accuracy.

In case that the SOC lookup table 270 is also staggered in values of charge/discharge rate (c-rate), a tri-linear interpolation may be used to determine the SOC value based on values of EMF, temperature T and C-rate:

$$\{EMF(t_0), T(t_0), C_{rate}(t_0)\} \mapsto SOC_{estimate}(t_0)$$

The SOC lookup table 270 typically depends on the type of battery used within the device. So, a suitable SOC lookup table 270 has to be available for the given type of battery. Said SOC lookup table 270 may be derived by a plurality of measurements of the SOC at given EMF and temperature values.

The SOC value provided by the state of charge estimator unit 265 may be a relative value, e.g. a percentage value of a full charge capacity. In order to derive a SOC value of unit [Ah], the SOC percentage value has to be multiplied with the full charge capacity (FCC) value of unit [Ah]. Said multiplication may be performed by a multiplier unit 275. The FCC value provided as an input to the multiplier unit 275 indicates the capacity of the fully charged battery in [Ah]. Thus, by multiplying the SOC percentage value and the FCC value, a SOC value of unit [Ah] is obtained.

Said SOC value of unit [Ah] is provided as an input to a SOC accumulator unit 280. The SOC accumulator unit 280 may be coupled with the coulomb counter 210 in order to receive information regarding the battery current $I_{Bat}$ provided to/from the battery. Based on said information, the SOC accumulator unit 280 is able to track the SOC value by accumulating charge entering/leaving the battery, which—as described before—suffers from an increasing tracking error $\int_0^t \varepsilon(t)\,dt$. The SOC value provided by the multiplier unit 275 may be used for calibrating the SOC accumulator unit 280 once in a while, i.e. the SOC value obtained by tracking SOC based on the battery current values of the coulomb counter 210 is corrected by using the SOC value of the multiplier unit 275. In other words, the SOC output of the SOC accumulator unit 280 is calibrated on a regular or irregular basis by means of the SOC value obtained by the SOC estimation described before.

The FCC value provided as an input to the multiplier unit 275 may be a fixed value indicating the FCC, or derived by a FCC estimator unit 285. It is worth mentioning that the FCC of a battery decreases with increasing battery age, respectively, with increasing number of charge/discharge cycles. Said FCC estimator unit 285 may calculate the present FCC of the battery based on incremental discharge ΔSOC between two (preferably subsequent) SOC estimation steps. In other words, the FCC is estimated by comparing the decay of SOC based on SOC values ([Ah]) provided by the SOC accumulator unit 280 with the decay of SOC based on SOC estimation values ([%]) provided by the state of charge estimator unit 265.

The FCC estimator unit 285 may use the following formula for determining the present FCC of the battery:

$$FCC_{estimate}[Ah] = \frac{100 * \Delta SOC[Ah]}{\Delta SOC_{estimate}[\%]}$$

wherein ΔSOC [Ah] is the charge difference between two successive SOC values provided by the SOC accumulator unit 280 and ΔSOC$_{estimate}$ [%] is the difference between two successive SOC values provided by the state of charge estimator unit 265. The output of the FCC estimator unit 285 may be used as an input of the multiplier unit 275. Furthermore, using estimated, present FCC value and nominal FCC value, the state of health (SOH) of the battery can be determined.

Alternatively or in addition, the SOH of the battery may be estimated by the FCC decay over time based on a lookup mechanism similar to the SOC estimator. Based on the calculated interior resistance $R_i$ of the battery, the SOH estimator may use a predetermined reference table for estimating the SOH of the battery by bi- or tri-linear table interpolation. For example, a mapping using multi-linear interpolation may be performed according to:

$$\{R_i(t_0), T(t_0), SOC(t_0)\} \mapsto SOH_{estimate}(t_0)$$

wherein $R_i(t_0)$ is the interior resistance of the battery at point of time $t_0$, $T(t_0)$ is the battery temperature at point of time $t_0$ and $SOC(t_0)$ is the state of charge of the battery at point of time $t_0$.

Figure 3:
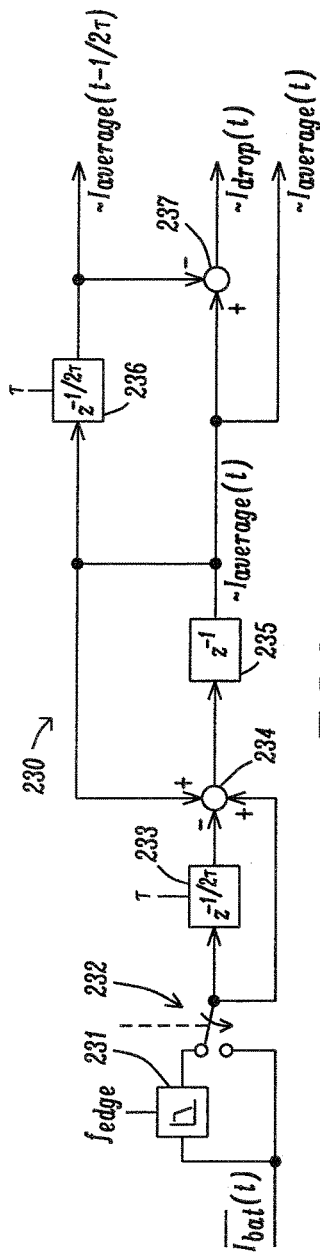
FIG. 3 illustrates an example schematic block diagram of the first pre-processing unit.

FIG. 3 shows in closer detail a block diagram of the first pre-processing unit 230. The input of the first pre-processing unit 230 may be directly or indirectly coupled with a switch 232. Indirect coupling in the present context means that the input is coupled via e.g. a filter unit 231 with the switch 232. The filter unit 231 may be, for example, a low-pass filter comprising a cut-off frequency $f_{edge}$. Said cut-off frequency $f_{edge}$ may be adjustable. Based on the filter unit 231, high frequency fluctuations of the battery current $I_{bat}$ can be filtered out. Depending on the switching status of the switch 232, either the unfiltered or the filtered input signal $I_{bat}$ is used for further signal processing. The switching status of the switch 232 may be chosen, according to the circumstances by a control signal provided to the switch 232.

As already mentioned before, the input signal $I_{bat}$ is a time-discrete signal, i.e. a series of sampled battery current values may be successively provided at consecutive points of time.

The first pre-processing unit 230 computes the current drop $I_{drop}$ in an observation window of fixed or configurable duration τ around the time of interest $t_0$ in real-time. The first pre-processing unit 230 comprises an integration means accumulating the filtered or unfiltered input signal $I_{bat}$. Said integration means may be constituted by a loop including a summation point 234 and delay entity 235. The delay entity 235 may delay the data by one sampling cycle. The output of the delay entity 235 is fed back to the summation point 234 thereby realizing an accumulation loop. A parallel branch comprises delay means 233 being adapted to delay the filtered or unfiltered input signal $I_{bat}$ by $$\frac{\tau}{2}$$

(halt the period of the observation window). The delayed data is subtracted at the summation point 234. Therefore, the output of the delay entity 235 ($I_{average}(t_0)$) is proportional to the average of the input data within a window of the duration of $$\frac{\tau}{2}:$$

$$I_{average}(t_0) = \overline{I_{bat}(t_0)}^{\frac{\tau}{2}} \sim \sum_{i=t_0-\frac{\tau}{2}}^{t_0} I_{bat}(t_i)$$

The output of the delay entity 235 is coupled with a further summation point 237. A parallel branch includes further delay entity 236 which is adapted to delay the output of the delay entity 235 ($I_{average}(t)$) by $$\frac{\tau}{2}.$$

The output of said further delay entity 236 ($I_{average}(t-\frac{1}{2}\tau)$) is coupled with a subtracting port of the summation point 237. Hence, the output of the summation point 237 ($I_{drop}$) is proportional to the change of battery current $I_{bat}$ within the observation window. The value of $I_{drop}$ may be used for deciding (by means of the event filter) whether an SOC estimation can be performed with desired accuracy.

Furthermore, the first pre-processing unit 230 provides further output signals which are used for estimating the SOC of the battery. For example, the output of the delay entity 235 (providing $I_{average}$ (t)-information) may be forwarded to the event filter unit 250 and the electromotive force unit 260. Similarly, also the output of the further delay entity 236 (providing $I_{average}$ (t-½τ)-information) is forwarded to the electromotive force unit 260.

It is worth mentioning that the first pre-processing unit 230 is a reconfigurable unit, e.g. the duration of the observation window τ or the cut-off frequency $f_{edge}$ are adjustable. Furthermore, the behavior of the first pre-processing unit 230 can be adapted to the given battery load scenario by controlling the position of the switch 232. Preferably, the first pre-processing unit 230 is implemented by a microprocessor for obtaining said reconfigurability.

The second pre-processing unit 240 used for providing the average value of the battery voltage in period $[t_0 \ldots t_0+\frac{1}{2}\tau]$ ($\overline{V_{bat}}^{\{t_0,t_0+1/2\tau\}}$) and the average value of the battery voltage in period $[t_0-\frac{1}{2}\tau \ldots t_0]$ ($\overline{V_{bat}}^{\{t_0-1/2\tau,t_0\}}$) may comprise the same or similar structure. Therefore, reference is made to the preceding description of the first pre-processing unit 230.

Figure 4:
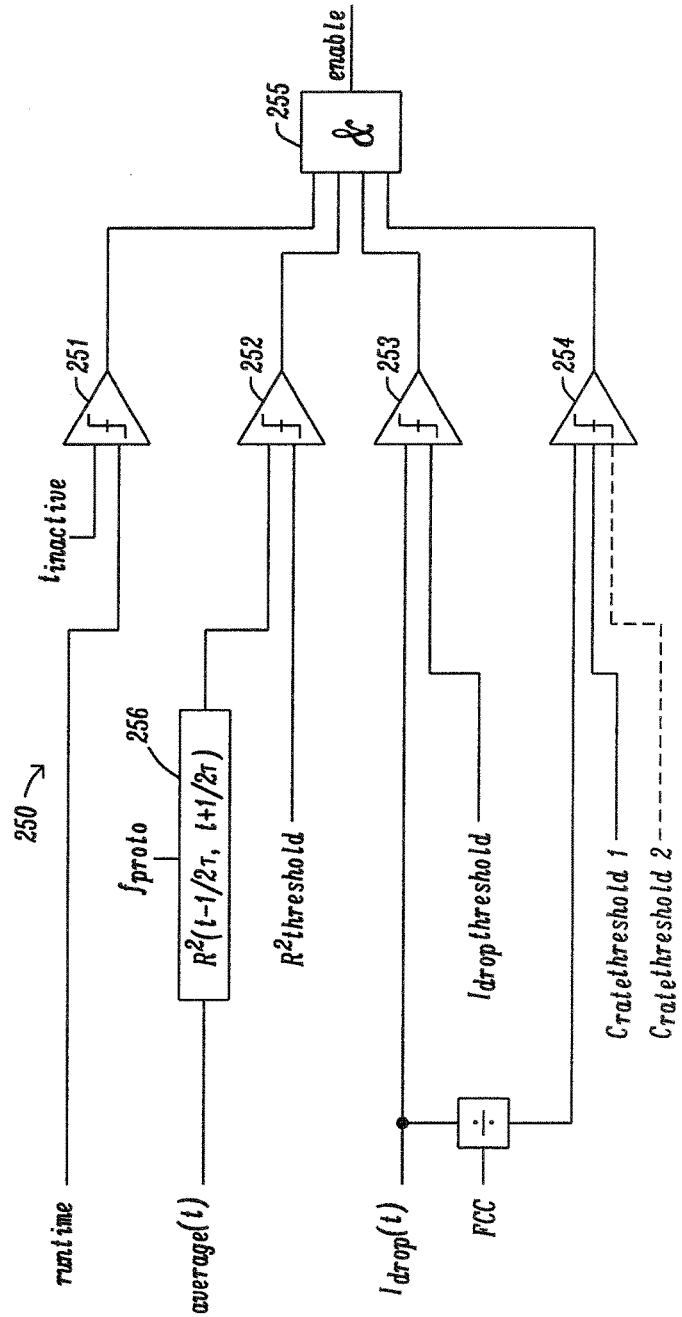
FIG. 4 illustrates an example schematic block diagram of the event filter unit.

FIG. 4 shows an example embodiment of the event filter unit 250. As already mentioned above, the task of the event filter unit 250 is to identify and localize rapid changes in the real-time data stream which are suitable for allowing a reliable EMF estimation. The event filter unit 250 may comprise multiple decision entities 251-254 by means of which different conditions are checked. The output of the decision entities 251-254 are coupled with the input of an AND-gate 255. An enabling signal may be provided at the output of said AND-gate 255 if all conditions covered by the decision entities 251-254 are fulfilled. Nevertheless, depending on the specific application case, it might also be sufficient that only a subset of said conditions is fulfilled.

A first decision entity 251 may check whether the period of time elapsed since the last re-calibration procedure is above a certain threshold. Therefore, the first decision entity 251 may receive time threshold information ($t_{inactive}$), said time threshold information providing a lower limit for the period of time elapsed since the last re-calibration procedure. The first decision entity 251 may further receive runtime information indicating the period of time elapsed since the last re-calibration procedure. If said runtime information is above the time threshold information, the first decision entity 251 provides an unblock signal (e.g. logical one) to the AND-gate 255.

Furthermore, the event filter unit 250 may comprise means for monitoring the shape of the time curve of the average current $I_{average}(t)$ and comparing said shape with a given prototype function $f_{proto}$ in order to determine if the shape of the time curve of the average current $I_{average}(t)$ is similar to said prototype function $f_{proto}$. For performing said comparison, the event filter unit 250 comprises a correlator entity 256 which performs the comparison of the shape of the time curve of the average current $I_{average}(t)$ and the prototype function $f_{proto}$. The prototype function $f_{proto}$ may be chosen according to the selected type of event that is considered for the calculation. The prototype function $f_{proto}$ may further be chosen according to the pre-processing, e.g. depending whether a filter function is applied at the input of the first pre-processing entity 230 or not. The output of the correlator entity 256 may be coupled with the second decision entity 252 which further receives a correlation threshold ($R^2$ threshold). In case that the value provided by the correlator entity 256 is above the correlation threshold, the second decision entity 252 provides an unblock signal (e.g. logical one) to the AND-gate 255.

In case that the correlator entity 256 comprises a configurable architecture, the selectivity of the correlator entity 256 can be varied. For example, the width T of the observation window can be extended and/or the threshold for $R^2$ can be raised for increasing the confidence that in case of providing an unblock signal, the present shape of the time curve of the average current $I_{average}(t)$ fits to the prototype function $f_{proto}$.

Based on the third decision entity 253, it is evaluated whether the drop of battery current $I_{drop}$ within the observation window exceeds a current drop threshold value ($I_{drop}$-threshold). Using said drop of battery current $I_{drop}$ as a basis for making the decision to start SOC estimation is advantageous because SOC estimation typically provides better accuracy if there is a significant change of battery current in a short time window (e.g. having a duration of 5 s to 50 s). As already mentioned before, $I_{drop}$ may be derived by determining the change of average battery current over a certain observation window. However, the decision of starting the SOC estimation can be also made by directly observing battery current samples in real-time and determine the change of battery current over an observation window of two or more samples. In case that the value of drop of battery current $I_{drop}$ is above the $I_{drop}$-threshold value, the third decision entity 253 provides an unblock signal (e.g. logical one) to the AND-gate 255.

As a further basis of making an decision to start SOC estimation, the charge or discharge rate (C-rate) may be determined because SOC estimation provides typically better accuracy if C-rate is above a certain threshold. The C-rate value is derived by dividing $I_{average}(t)$ by full charge capacity FCC (provided as affixed value or by FCC estimator 285). For making the decision, a fourth decision entity 254 is included in the event filter unit 250. In case that the C-rate value is above a given C-rate threshold value, the fourth decision entity 254 provides an unblock signal (e.g. logical one) to the AND-gate 255. Alternatively, a window comparator may be used which may receive two C-rate threshold values (C-rate threshold1, C-rate threshold2). Thereby, it is possible to check whether present C-rate value is within the desired C-rate range bounded by said C-rate threshold values. Thereby, it is possible to use a 3-dimensional SOC lookup table 270. In case of using a 4-dimensional SOC lookup table 270 (staggered in battery voltage $V_{bat}$, temperature T and C-rate), checking the C-rate condition might be waived.

If all paths of the event filter provide an unblock-signal to the AND-gate 255, an enabling signal may be provided by the event filter which triggers the SOC estimation process described above.

Figure 5:
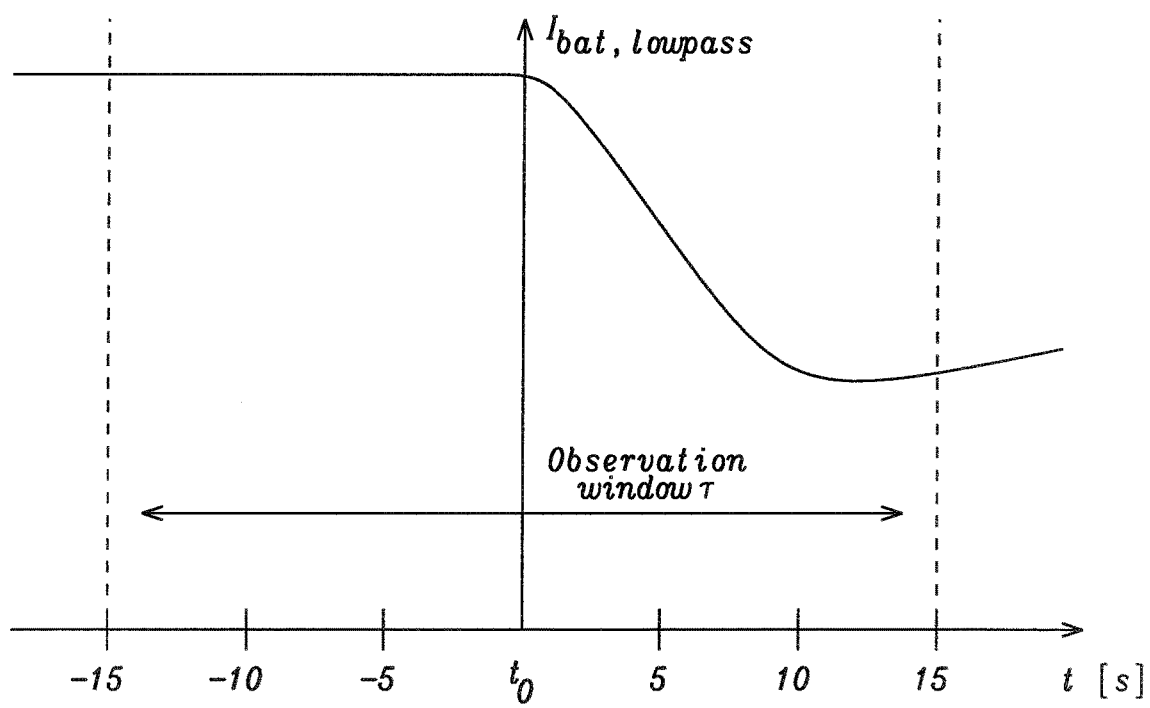
FIG. 5 illustrates example graphs of the battery current and the output of the correlator.
Figure 5:
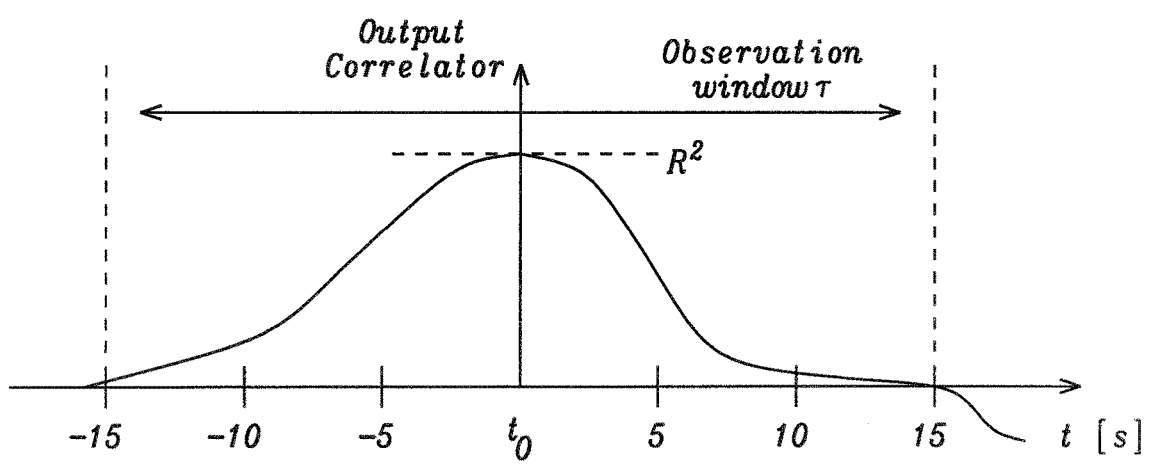

FIG. 5 shows in the upper graph the low-pass filtered battery current $I_{bat,lowpass}$ over time t and in the lower graph the output of the correlator entity 256 over time t. In the present case, the observation window comprises, for example, a width of τ=30 sec. As already mentioned before, the length of the observation window can be varied in order to adapt the SOC estimation to the present needs (e.g. depending on the type of battery, the type of device which is powered by the battery etc.). As shown by the battery current curve, the low-pass filtered battery current $I_{bat,lowpass}$ decreases starting at point of time $t_0$, e.g. because the mobile phone powered by the battery receives a call or enables the power amplifier to send a status message.

The output of the correlator 256 is indicative for the similarity of the battery current curve and the prototype function $f_{proto}$ provided to said correlator 256. In the present case, the prototype function $f_{proto}$ is a step function (step from a higher level to a lower level). As shown in FIG. 5, the output values of the correlator rise in the left half of the observation window. At point of time $t_0$, the correlator 256 indicates a significant correlation between the battery current curve and the prototype function $f_{Proto}$. Said maximum of the correlator output values exceeds the $R^2$-threshold value and provides an unblock signal to the AND-gate of the event filter 250 (FIG. 4). In case that upper-mentioned further conditions checked by the event filter 250 are also fulfilled, the SOC estimation process can be started.

Figure 6:
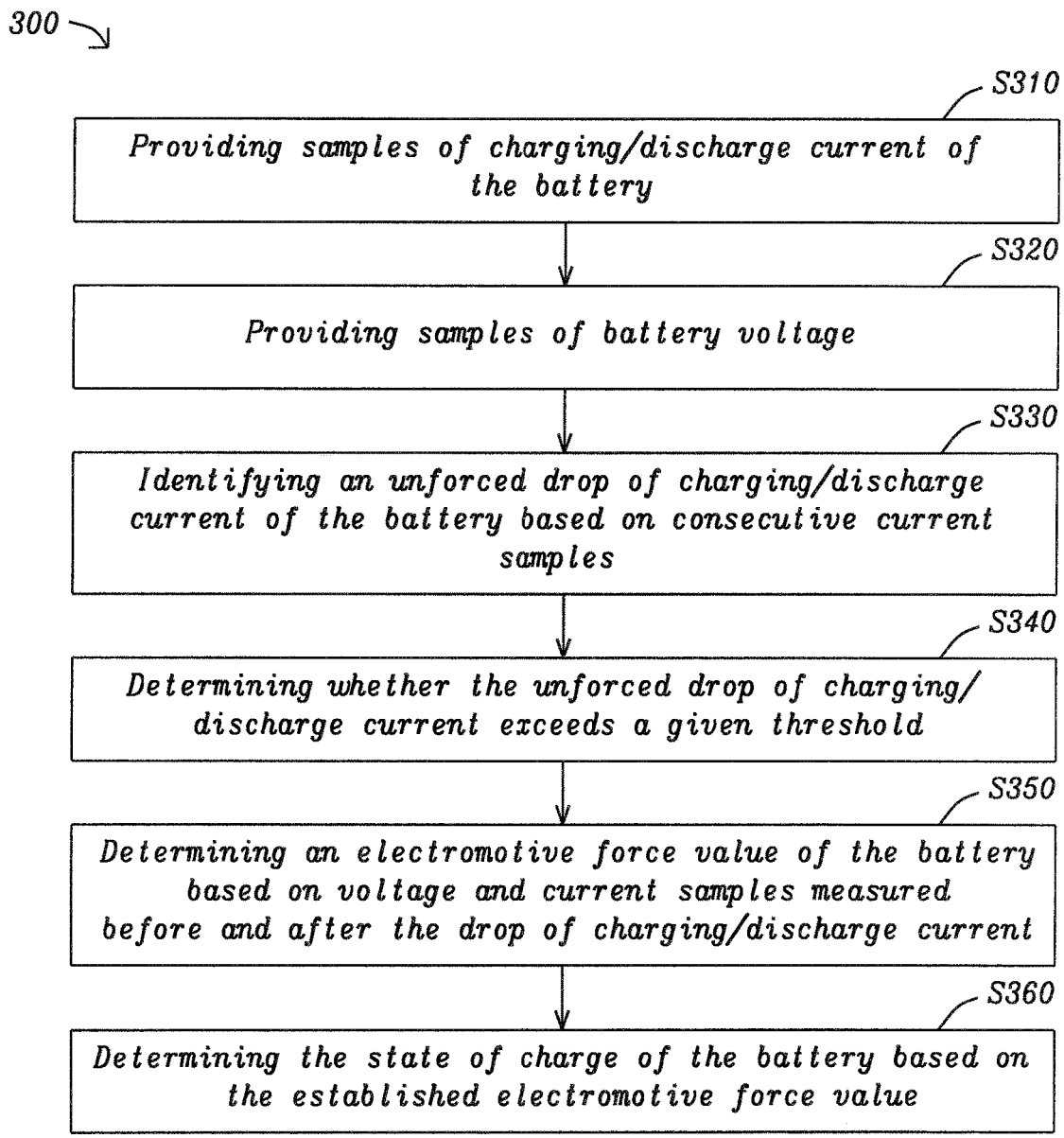
FIG. 6 illustrates an example flow chart of a method for determining the state of charge of a rechargeable battery.

FIG. 6 shows a flowchart 300 indicating the steps of a method for determining the state of charge of a rechargeable battery.

First, the current provided to or from the battery is sampled thereby establishing current samples (S310). Similarly, the battery voltage is sample thereby establishing voltage samples (S320).

Said established real-time samples or information derived from said real-time samples (e.g. after integrating the current or establishing an average value of multiple samples) are used to determine whether an unforced drop occurred. Said unforced drop may be detected at point of time $t_0$ (S330).

Following up, it is checked whether the unforced drop exceeds a certain threshold (S340). Optionally, a correlation with a prototype function may be performed. If the unforced drop is detected (or confirmed by a second measuring), an electromotive force value of the battery is established based on voltage samples and current samples before and after the point of time $t_0$ (S350). In other words, battery voltage and battery current information close to point of time $t_0$ is used for calculating the current electromotive force of the battery. For example, an observation window may be used which comprises a certain width. Battery voltage and battery present information at the borders of the observation window may be used for determining the current electromotive force of the battery, said observation window being centered at/around the point of time $t_0$.

Finally, the state of charge of the battery is determined based on the electromotive force value (S360).

Summing up, an improved battery fuel gauge circuit and a method for determining the state of charge of a rechargeable battery have been proposed. The battery fuel gauge circuit may comprise:
- a real time clock;
- a coulomb counter;
- a voltage sensor;
- a thermal sensor;
- signal pre-conditioning, respectively, pre-processing (hardware or software-implemented);
- an event filter (hardware- or software-implemented) comprising, at least but not mandatory exclusive:
  - a real-time correlator having a limited length r of the observation window which is fixed or configurable;
  - a threshold comparator for the correlation coefficient $R^2$ whereas the threshold is fixed or configurable;
  - a threshold or a window comparator for $I_{average}$ (t) or $C_{rate-average}$ (t) whereas the threshold(s) is/are fixed or configurable;
  - a threshold or window comparator for the load current drop or range whereas the threshold is fixed or configurable;
- an apparatus performing a table lookup and bi- or tri-linear interpolation of the resulting values (hardware- or software-implemented);
- a characteristic, battery chemistry specific, lookup table (3D or 4D).

The elements listed above can be implemented
in hardware using analogue and/or digital hardware circuits;
in software running on an embedded processor or an external host; or
using a combination of both.

The main advantage of the proposed battery fuel gauge circuit is that the battery does not have to reach a certain state for estimating SOC and performing error concealment based on said estimated SOC, but the SOC-estimation can be performed in any state of charge. Only one or more load conditions have to be fulfilled in order to allow a reliable SOC estimation. Said load conditions are typically reached during the normal operation of the battery-powered device, i.e. SOC estimation can be performed on-the-fly if said load conditions are detected.

In the present document, the term "couple" or "coupled" refers to elements being in electrical communication with each other, whether directly connected e.g., via wires, or in some other manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope.

Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. Battery fuel gauge circuit for determining the state of charge of a rechargeable battery, the circuit comprising:
   a coulomb counter for providing values that are indicative of a charging current or discharge current provided to/by the battery;
   a voltage sensor for providing voltage samples of a voltage provided by the battery;
   a first pre-processing unit being adapted to provide a current change estimate based on the values provided by the coulomb counter, said current change estimate indicating an unforced drop of charging/discharge current being detected at point of time $t_0$;
   an event filter unit adapted to confirm whether the current change estimate exceeds a certain threshold;
   an electromotive force unit adapted to determine an electromotive force value of the battery based on voltage and current information before and after a confirmed current change estimate indicating a drop of charging/discharge current at point of time $t_0$;
   a state of charge estimator unit being adapted to determine the state of charge of the battery based on the electromotive force value provided by the electromotive force unit.

2. Battery fuel gauge circuit according to claim 1, wherein the event filter unit further comprises a correlator, said correlator receiving information derived from the charging/discharge current and a prototype function, wherein the correlator is adapted to determine whether the information derived from the charging/discharge current and the prototype function comprise a similar shape.

3. Battery fuel gauge circuit according to claim 1, wherein the event filter unit is further adapted to determine whether a charge or discharge rate of the battery is above a given charge/discharge rate threshold.

4. Battery fuel gauge circuit according to claim 1, wherein the electromotive force unit comprises an enabling port, said enabling port being coupled with the output of the event filter unit in order to trigger the electromotive force unit by the event filter unit.

5. Battery fuel gauge circuit according to claim 1, wherein the first pre-processing unit is adapted to provide said current change estimate based on a certain observation window.

6. Battery fuel gauge circuit according to claim 1, wherein the first pre-processing unit is adapted to provide a first average current value, said first average current value being established based on values from the coulomb counter for a first half of the observation window, and a second average current value, said second average current value being established based on values from the coulomb counter for a second half of the observation window.

7. Battery fuel gauge circuit according to claim 1, comprising a second pre-processing unit, the second pre-processing unit receiving voltage samples from the voltage sensor and being coupled with the electromotive force unit for providing a first average voltage value and a second average voltage value to the electromotive force unit, said first average voltage value being established based on voltage samples within a first half of the observation window and said second average voltage value being established based on voltage samples within a second half of the observation window.

8. Battery fuel gauge circuit according to claim 1, wherein the first and/or second pre-processing unit is adapted to filter the values from the coulomb counter, current samples derived thereof and/or voltage samples by means of a low-pass filter.

9. Battery fuel gauge circuit according to claim 1, wherein the electromotive force unit is adapted to calculate the electromotive force (EMF) of the battery based on the following formula:

$$EMF(t_0) = \frac{\overline{V_{bat}}^{\{t_0, t_0+1/2\tau\}} * \overline{I_{bat}}^{\{t_0-1/2\tau, t_0\}} - \overline{V_{bat}}^{\{t_0-1/2\tau, t_0\}} * \overline{I_{bat}}^{\{t_0, t_0+1/2\tau\}}}{I_{drop}(t_0)}$$

wherein:
  $\tau$: observation window;
  $\overline{V_{bat}}^{\{t_0-1/2\tau, t_0\}}$: first average voltage value;
  $\overline{V_{bat}}^{\{t_0, t_0+1/2\tau\}}$: second average voltage value;
  $\overline{I_{bat}}^{\{t_0-1/2\tau, t_0\}}$: first average current value;
  $\overline{I_{bat}}^{\{t_0, t_0+1/2\tau\}}$: second average current value; and
  $I_{drop}(t_0)$ change of current within the observation window $\tau$.

10. Battery fuel gauge circuit according to claim 1, wherein the state of charge estimator unit is adapted to determine the state of charge of the battery based on a look-up table, said look-up table providing a state of charge value based on the electromotive force value provided by the electromotive force unit.

11. Battery fuel gauge circuit according to claim 10, wherein the state of charge estimator unit is coupled with a temperature sensor, the temperature sensor measuring the temperature of the battery, wherein the look-up table provides a state of charge value based on the electromotive force value and said measured temperature.

12. Battery fuel gauge circuit according to claim 1, wherein the output of the state of charge estimator unit is used for recalibrating the state of charge measurement value provided by a state of charge accumulator, said state of charge accumulator providing a state of charge measurement value based on values provided by the coulomb counter.

13. Battery fuel gauge circuit according to claim 12, comprising a full charge capacity estimator being adapted to estimate the full charge capacity of the battery based on consecutive state of charge estimation values provided by the state of charge estimator unit and consecutive state of charge measurement values provided by the state of charge accumulator.

14. Battery fuel gauge circuit according to claim 1, comprising a state of health estimator unit, said state of health estimator unit being adapted to calculate the interior resistivity value of the battery based on voltage and values from the coulomb counter and estimate the state of health value based on a look-up table, the look-up table indicating a state of health value based on the interior resistivity value, the temperature of the battery and the state of charge of the battery.

15. Method for determining the state of charge of a rechargeable battery, the method comprising the steps of:
  sampling a charging current or discharge current provided to/from the battery thereby establishing current samples;
  sampling a voltage provided by the battery thereby establishing voltage samples;
  detecting a current change estimate based on said current samples, said current change estimate indicating an unforced drop of charging/discharge current being detected at point of time $t_0$;
  determining whether the current change estimate exceeds a certain threshold;
  determining an electromotive force value of the battery based on voltage samples and current samples before and after the point of time $t_0$ when the current change estimate exceeds said threshold; and
  determining the state of charge of the battery based on the electromotive force value.

16. The method according to claim 15, wherein the event filter unit further comprises a correlator, said correlator receiving information derived from the charging/discharge current and a prototype function, wherein the correlator is adapted to determine whether the information derived from the charging/discharge current and the prototype function comprise a similar shape.

17. The method according to claim 15, wherein the event filter unit is further adapted to determine whether a charge or discharge rate of the battery is above a given charge/discharge rate threshold.

18. The method according to claim 15, wherein the electromotive force unit comprises an enabling port, said enabling port being coupled with the output of the event filter unit in order to trigger the electromotive force unit by the event filter unit.

19. The method according to claim 15, wherein the first pre-processing unit is adapted to provide said current change estimate based on a certain observation window.

20. The method according to claim 15, wherein the first pre-processing unit is adapted to provide a first average current value, said first average current value being established based on values from the coulomb counter for a first half of the observation window, and a second average current value, said second average current value being established based on values from the coulomb counter for a second half of the observation window.

21. The method according to claim 15, comprising a second pre-processing unit, the second pre-processing unit receiving voltage samples from the voltage sensor and being coupled with the electromotive force unit for providing a first average voltage value and a second average voltage value to the electromotive force unit, said first average voltage value being established based on voltage samples within a first half of the observation window and said second average voltage value being established based on voltage samples within a second half of the observation window.

22. The method according to claim 15, wherein the first and/or second pre-processing unit is adapted to filter the values from the coulomb counter, current samples derived thereof and/or voltage samples by means of a low-pass filter.

23. The method according to claim 15, wherein the electromotive force unit is adapted to calculate the electromotive force (EMF) of the battery based on the following formula:

$$EMF(t_0) = \frac{\overline{V_{bat}}^{\{t_0, t_0+1/2\tau\}} * \overline{I_{bat}}^{\{t_0-1/2\tau, t_0\}} - \overline{V_{bat}}^{\{t_0-1/2\tau, t_0\}} * \overline{I_{bat}}^{\{t_0, t_0+1/2\tau\}}}{I_{drop}(t_0)}$$

wherein:
$\tau$: observation window;
$\overline{V_{bat}}^{\{t_0-1/2\tau, t_0\}}$: first average voltage value;
$\overline{V_{bat}}^{\{t_0, t_0+1/2\tau\}}$: second average voltage value;
$\overline{I_{bat}}^{\{t_0-1/2\tau, t_0\}}$: first average current value;
$\overline{I_{bat}}^{\{t_0, t_0+1/2\tau\}}$: second average current value; and
$I_{drop}(t_0)$ change of current within the observation window $\tau$.

24. The method according to claim 15, wherein the state of charge estimator unit is adapted to determine the state of charge of the battery based on a look-up table, said look-up table providing a state of charge value based on the electromotive force value provided by the electromotive force unit.

25. The method according to claim 24, wherein the state of charge estimator unit is coupled with a temperature sensor, the temperature sensor measuring the temperature of the battery, wherein the look-up table provides a state of charge value based on the electromotive force value and said measured temperature.

26. The method according to claim 15, wherein the output of the state of charge estimator unit is used for recalibrating the state of charge measurement value provided by a state of charge accumulator, said state of charge accumulator providing a state of charge measurement value based on values provided by the coulomb counter.

27. The method according to claim 26, comprising a full charge capacity estimator being adapted to estimate the full charge capacity of the battery based on consecutive state of charge estimation values provided by the state of charge estimator unit and consecutive state of charge measurement values provided by the state of charge accumulator.

28. The method according to claim 15, comprising a state of health estimator unit, said state of health estimator unit being adapted to calculate the interior resistivity value of the battery based on voltage and values from the coulomb counter and estimate the state of health value based on a look-up table, the look-up table indicating a state of health value based on the interior resistivity value, the temperature of the battery and the state of charge of the battery.

* * * * *